(12) United States Patent
Gaudette

(10) Patent No.: US 8,090,565 B2
(45) Date of Patent: *Jan. 3, 2012

(54) SYSTEM AND METHOD FOR USING MODEL ANALYSIS TO GENERATE DIRECTED TEST VECTORS

(75) Inventor: Thomas Gaudette, Jamaica Plain, MA (US)

(73) Assignee: The MathWorks, Inc., Natick, MA (US)

( * ) Notice: Subject to any disclaimer, the term of this patent is extended or adjusted under 35 U.S.C. 154(b) by 347 days.

This patent is subject to a terminal disclaimer.

(21) Appl. No.: 11/970,897

(22) Filed: Jan. 8, 2008

(65) Prior Publication Data

US 2008/0109194 A1    May 8, 2008

Related U.S. Application Data

(63) Continuation of application No. 11/173,977, filed on Jun. 30, 2005, now Pat. No. 7,970,594.

(51) Int. Cl.
*G06F 11/277* (2006.01)

(52) U.S. Cl. ............ 703/13; 703/6; 703/14; 703/16; 703/17; 703/20; 703/21; 714/100; 714/2; 714/3; 714/32; 714/44; 714/46; 714/715; 714/735; 714/736; 714/737; 714/738; 714/742; 716/100; 716/105; 716/106; 716/107; 716/111; 716/136

(58) Field of Classification Search ............... 703/13, 703/14, 20, 6, 15, 16, 17, 21; 714/44, 715, 714/735, 736, 742, 100, 2, 3, 32, 46, 737, 714/738; 716/5, 106, 100, 105, 107, 111, 716/136

See application file for complete search history.

(56) References Cited

U.S. PATENT DOCUMENTS

| 4,320,509 A | * | 3/1982 | Davidson | ............... 714/732 |
| 4,937,765 A | | 6/1990 | Shupe et al. | |
| 5,189,365 A | * | 2/1993 | Ikeda et al. | ............... 714/33 |

(Continued)

FOREIGN PATENT DOCUMENTS

WO    WO 99/08212 A1    2/1999

OTHER PUBLICATIONS

Taylor, Tony et al., "Tools and Techniques for Converting Simulation Models into Test Patterns," Proceedings, International Test Conference 1993, pp. 133-138.

(Continued)

*Primary Examiner* — Kamini S Shah
*Assistant Examiner* — Kibrom Gebresilassie
(74) *Attorney, Agent, or Firm* — Cesari and McKenna, LLP; Michael R. Reinemann

(57) ABSTRACT

In one embodiment, a system model models characteristics of a real-world system. The system model includes a plurality of sub-portions that each correspond to a component of the real-world system. A plurality of test vectors are applied to the system model and coverage achieved by the test vectors on the sub-portions of the system model is measured. In response to a failure of the real world system, a suspected failed component of the real-world system is matched to a particular sub-portion of the system model. A test vector to be applied to the real-world system to test the suspected failed component is selected in response to coverage achieved on the particular sub-portion of the system model.

28 Claims, 9 Drawing Sheets

U.S. PATENT DOCUMENTS

| | | | |
|---|---|---|---|
| 5,475,624 A | 12/1995 | West | |
| 5,483,544 A * | 1/1996 | Shur | 714/738 |
| 5,513,339 A * | 4/1996 | Agrawal et al. | 703/15 |
| 5,515,384 A * | 5/1996 | Horton, III | 714/732 |
| 5,570,376 A * | 10/1996 | Kunda et al. | 714/736 |
| 5,581,742 A * | 12/1996 | Lin et al. | 716/113 |
| 5,712,857 A * | 1/1998 | Whitman et al. | 714/724 |
| 5,717,928 A * | 2/1998 | Campmas et al. | 716/17 |
| 5,724,504 A | 3/1998 | Aharon et al. | |
| 5,790,565 A * | 8/1998 | Sakaguchi | 714/738 |
| 5,815,513 A | 9/1998 | Hiraide | |
| 5,923,567 A * | 7/1999 | Simunic et al. | 438/17 |
| 5,944,847 A * | 8/1999 | Sanada | 714/741 |
| 6,058,253 A | 5/2000 | Lowe | |
| 6,076,173 A * | 6/2000 | Kim et al. | 714/25 |
| 6,141,630 A | 10/2000 | McNamara et al. | |
| 6,151,694 A * | 11/2000 | Nozuyama | 714/724 |
| 6,197,605 B1 * | 3/2001 | Simunic et al. | 438/14 |
| 6,205,559 B1 * | 3/2001 | Sakaguchi | 714/25 |
| 6,223,313 B1 * | 4/2001 | How et al. | 714/724 |
| 6,237,117 B1 * | 5/2001 | Krishnamoorthy | 714/724 |
| 6,253,344 B1 | 6/2001 | Fin et al. | |
| 6,342,790 B1 * | 1/2002 | Ferguson et al. | 324/765 |
| 6,467,058 B1 | 10/2002 | Chakradhar et al. | |
| 6,484,135 B1 | 11/2002 | Chin et al. | |
| 6,487,700 B1 * | 11/2002 | Fukushima | 716/106 |
| 6,532,440 B1 * | 3/2003 | Boppana et al. | 703/14 |
| 6,615,379 B1 * | 9/2003 | Tripp et al. | 714/736 |
| 6,631,344 B1 | 10/2003 | Kapur et al. | |
| 6,675,138 B1 | 1/2004 | Hollander et al. | |
| 6,687,662 B1 | 2/2004 | McNamara et al. | |
| 6,810,372 B1 | 10/2004 | Unnikrishnan et al. | |
| 6,848,088 B1 | 1/2005 | Levitt et al. | |
| 6,865,706 B1 | 3/2005 | Rohrbaugh et al. | |
| 6,874,135 B2 | 3/2005 | Gupta et al. | |
| 6,876,934 B2 | 4/2005 | Marlett | |
| 6,883,150 B2 | 4/2005 | Soltis et al. | |
| 6,952,796 B2 * | 10/2005 | Watanabe | 714/744 |
| 6,968,286 B1 | 11/2005 | Watkins | |
| 7,107,190 B1 * | 9/2006 | Tsuchiya et al. | 703/1 |
| 7,114,111 B2 | 9/2006 | Noy | |
| 7,137,083 B2 * | 11/2006 | Hildebrant | 716/112 |
| 7,139,955 B2 | 11/2006 | Rohrbaugh et al. | |
| 7,181,376 B2 | 2/2007 | Fine et al. | |
| 7,219,287 B1 * | 5/2007 | Toutounchi et al. | 714/738 |
| 7,237,161 B2 | 6/2007 | Volz | |
| 7,237,166 B2 | 6/2007 | Weller et al. | |
| 7,239,978 B2 * | 7/2007 | Cheng et al. | 702/185 |
| 7,260,793 B2 | 8/2007 | Boateng | |
| 7,337,102 B2 | 2/2008 | Mosterman | |
| 7,617,468 B2 | 11/2009 | Thakur et al. | |
| 7,623,981 B2 * | 11/2009 | Achkar et al. | 702/108 |
| 7,984,353 B2 * | 7/2011 | Furukawa et al. | 714/738 |
| 2002/0073375 A1 | 6/2002 | Hollander | |
| 2004/0000922 A1 * | 1/2004 | Witte | 324/765 |
| 2004/0017213 A1 * | 1/2004 | Witte | 324/752 |
| 2004/0025123 A1 * | 2/2004 | Angilivelil | 716/4 |
| 2004/0034495 A1 * | 2/2004 | Marlett | 702/117 |
| 2004/0044973 A1 | 3/2004 | Parker et al. | |
| 2004/0073892 A1 | 4/2004 | Fallah et al. | |
| 2004/0163023 A1 * | 8/2004 | Ishida et al. | 714/738 |
| 2004/0181763 A1 | 9/2004 | Soltis et al. | |
| 2004/0216023 A1 | 10/2004 | Maoz et al. | |
| 2004/0230928 A1 | 11/2004 | Nozuyama | |
| 2004/0249618 A1 | 12/2004 | Fine et al. | |
| 2005/0010886 A1 * | 1/2005 | Urata et al. | 716/6 |
| 2005/0131665 A1 | 6/2005 | Ho et al. | |
| 2005/0165793 A1 | 7/2005 | Mosterman | |
| 2005/0240887 A1 | 10/2005 | Rajski et al. | |
| 2005/0278599 A1 * | 12/2005 | Fujiwara et al. | 714/742 |
| 2006/0041814 A1 | 2/2006 | Rajski et al. | |
| 2006/0048026 A1 | 3/2006 | Fine et al. | |
| 2006/0248390 A1 * | 11/2006 | Hori et al. | 714/28 |
| 2007/0245188 A1 * | 10/2007 | Ono | 714/724 |
| 2007/0282556 A1 * | 12/2007 | Achkar et al. | 702/108 |
| 2008/0092004 A1 | 4/2008 | Watkins et al. | |
| 2009/0037858 A1 * | 2/2009 | Thakur et al. | 716/5 |
| 2009/0063086 A1 * | 3/2009 | Kawasaki | 702/117 |
| 2009/0077441 A1 * | 3/2009 | Huynh et al. | 714/741 |
| 2009/0282307 A1 | 11/2009 | Chaturvedula et al. | |
| 2010/0229039 A1 * | 9/2010 | Chikada | 714/27 |
| 2010/0235136 A1 | 9/2010 | Bassett et al. | |

OTHER PUBLICATIONS

International Search Report for Application No. PCT/US2006/025539, dated Jun. 30, 2005.

U.S. Appl. No. 11/173,977, filed Jun. 30, 2005, by Thomas Gaudette, for a System and Method for Using Model Analysis to Generate Directed Test Vectors.

"Simulink Verification and Validation: For Use with Simulink: Users Guide Version 1," The MathWorks, Inc., Jun. 2004, pp. i-v, 1-2 to 1-4, 2-1 to 2-20, 3-1 to 3-22, 4-1 to 4-20, 5-1 to 5-56, 6-1 to 6-10, and Index-1 to Index-4.

S. M. Prabhu, and P. J. Mosterman, "Model-Based Design of a Power Window System: Modeling, Simulation, and Validation," pp. 1-11, Jan. 26-29, 2004.

"Simulink Verification and Validation User's Guide Version 1," The MathWorks, Inc., Jun. 2004, pp. i to iv, 1-1 to 1-4, 2-1 to 2-20, 3-1 to 3-22, 5-1 to 5-56, and Index-1 to Index-4.

J. Desel, V. Milijic, and C. Neumair, "Model Validation in Controller Design", ACPN 2003, pp. 467-495, 2004.

Riesgo, T. Torroja, Y. de la Torre, E. Uceda, J., "Quality estimation of test vectors and functional validation procedures based on fault and error models", Feb. 23-26, 1998, pp. 1-2.

* cited by examiner

Decisions analyzed: ———145

| logical trigger input | 50% |
|---|---|
| false (output is from 3rd input port) | 0/17940 |
| true (output is from 1st input port) | 17940/17940 |

*Fig. 6*

Conditions analyzed: ———147

| Description: | #1 T | #1 F |
|---|---|---|
| input port 1 | 481 | 17060 |
| input port 2 | 0 | 17541 |

*Fig. 7*

———149
MC/DC analysis (combinations in parentheses did not occur)

| Decision/Condition: | #1 True Out | #1 False Out |
|---|---|---|
| expression for output | | |
| input port 1 | FF | TF |
| input port 2 | FF | (FT) |

*Fig. 8*

SYSTEM AND METHOD FOR USING MODEL ANALYSIS TO GENERATE DIRECTED TEST VECTORS

CROSS-REFERENCE TO RELATED APPLICATION

This application is a continuation of U.S. patent application Ser. No. 11/173,977, Now Pat. No. 7,970,594, which was filed on Jun. 30, 2005, by Thomas Gaudette for a SYSTEM AND METHOD FOR USING MODEL ANALYSIS TO GENERATE DIRECTED TEST VECTORS.

FIELD OF THE INVENTION

The illustrative embodiment of the present invention relates generally to model analysis and more particularly to the use of data obtained during model analysis to subsequently generate directed test vectors to identify errors in a deployed system.

BACKGROUND

The overall life-cycle of engineered systems typically starts with a requirements capture for a system model being designed and continues to the maintenance of the deployed real-life system based on the model. Frequently, the maintenance of the deployed system costs as much as the initial design of the system with the result that good maintenance technologies have taken on an increased importance.

Much of the present day repair aspect of maintenance schemes relies on the use of measurement trees. Measurement trees are a hierarchical tree-like arrangement of acceptable operating parameters for different components in a system. Starting from a root diagnosis as to which component may be faulty in a system, a selection of measurements can be made on the system that is behaving erratically. Each of the measurements rules out a number of branches on the tree which relate to different sub-components of the suspected faulty component. As a path along the tree is traversed by making additional measurements, a detected failure can ultimately be pinpointed to a replaceable component.

Conventionally problems with deployed systems based on a computer designed model have been diagnosed using two types of mechanisms. Diagnosis of problems has been made through the use of heuristics or the previous experiences of the user tasked with identifying the cause of the system fault. Some analysis is performed through a combination of the mechanisms. Unfortunately these approaches fail to take advantage of the information gathered during the design phase of the system when the system model undergoes testing to make sure it satisfies the set of requirements for the system design.

BRIEF SUMMARY

The illustrative embodiment of the present invention exploits the data gathered about a system model during the system design phase to aid the identification of errors subsequently detected in a deployed system based on the system model. The present invention utilizes the coverage analysis from the design phase that is originally created to determine whether the system model as designed meets the specified system requirements. Included in the coverage analysis report is the analysis of which sets of test vectors utilized in simulating the system model excited individual components and sections of the system model. The present invention uses the information associated with the test vectors to select appropriate test vectors to use to perform directed testing of the deployed system so as to confirm a suspected fault.

In one embodiment, a method of identifying errors in a deployed system in a technical computing environment is performed and includes the step of testing a system model being designed with multiple sets of test vectors. The testing identifies a degree of model capture associated with each set of the multiple sets of test vectors. The multiple sets of test vectors are saved following testing. The method further includes the step of identifying an error in the functioning of a deployed system based on the system model using the test vectors from the previous analysis.

In another embodiment in an electronic device with a technical computing environment, a system for detecting errors in deployed systems based on system models includes a system model for a real system being designed in the technical computing environment. The system also includes a test system for testing the system model. The test system simulates the execution of the system model with multiple sets of test vectors. The multiple sets of test vectors and their associated data are saved following testing. The system additionally includes a coverage analysis report of the results of a simulation of the system model with the test system. The coverage analysis report is subsequently used to select at least one of the multiple sets of test vectors to perform directed testing to identify an error reported in a deployed system based on the system model.

In one embodiment, a method of identifying errors in a deployed system in a technical computing environment is performed and includes the step of providing a model coverage analysis report for a model identifying a degree of model capture associated with each of multiple sets of vectors. The method additionally includes the step of receiving a notification of an error in the functioning of a deployed system based on the system model. The method further includes the step of identifying an error in the functioning of a deployed system based on the system model using the model coverage analysis report and at least one of the multiple sets of vectors.

BRIEF DESCRIPTION OF THE DRAWINGS

FIG. 6 depicts a screenshot of a decision analysis report;

FIG. 7 depicts a screenshot of a condition analysis report; and

FIG. 8 depicts a screenshot of a modified condition decision coverage analysis report;

DETAILED DESCRIPTION

The present invention takes advantage of the increased data gathered about systems during their design in technical computing environments in order to perform subsequent fault identification and validate repairs to the system. The increasing use of computer modeling in the different aspects of the design process has led to the growing availability of high fidelity models that capture different characteristics of the system that was designed. Additionally the use of automatic code generation provides a very close link between model and implementation. The use of the data gathered from the test of the system model thus enables subsequent operations performed on deployed systems to be conducted in a more rapid and efficient manner than was possible with conventional methods used to diagnose faults.

Figure 1:
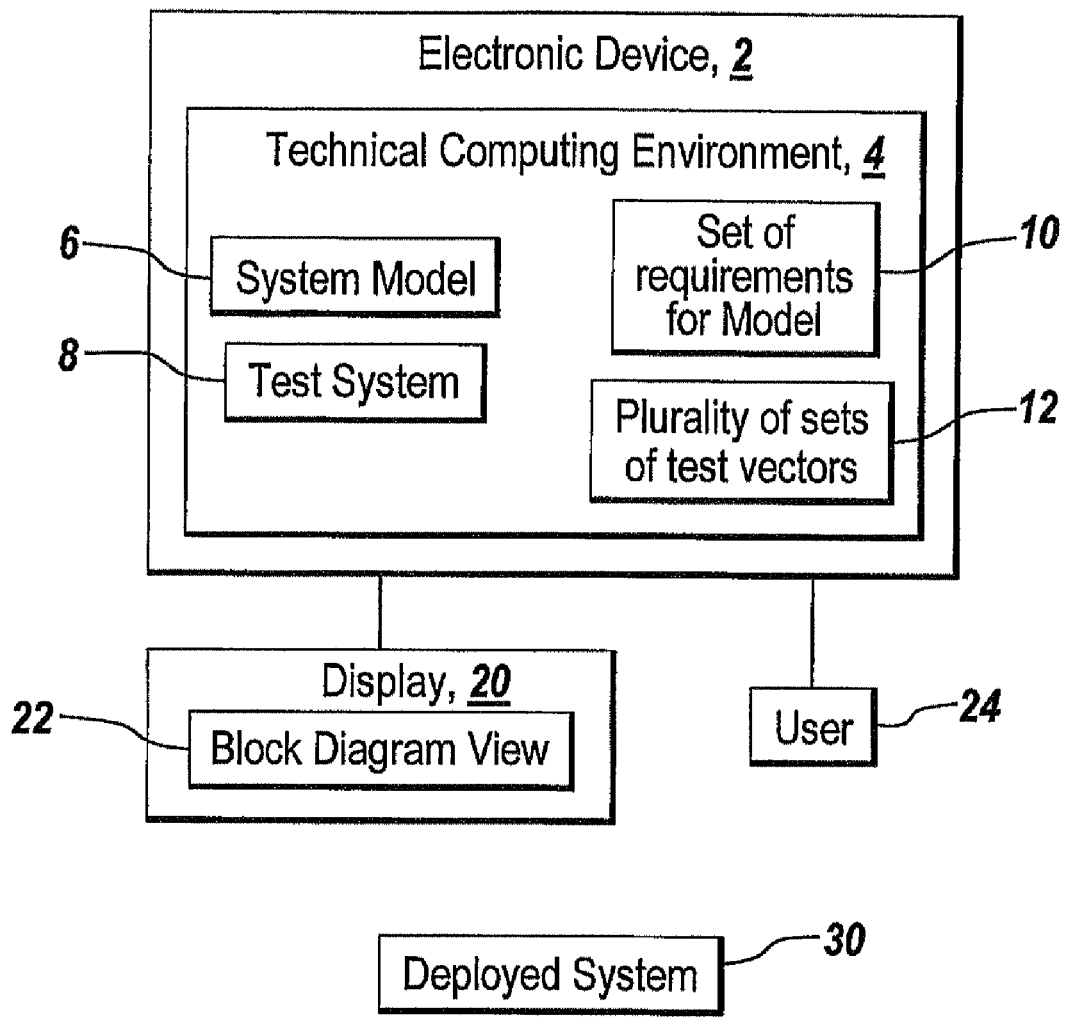
FIG. 1 depicts an environment suitable for practicing the illustrative embodiment of the present invention.

FIG. 1 depicts an environment suitable for practicing the illustrative embodiment of the present invention. An electronic device 2 hosts a technical computing environment 4. The technical computing environment 4 such as MATLAB or SIMULINK both from The MathWorks, Inc. of Natick, Mass., includes a system model 6 of a system being designed. The technical computing environment 4 may also include a test system 8 able to execute the system model 6. Alternatively, the test system may be located outside the technical computing environment. Additionally, the technical computing environment 4 may include a set of requirements for the model 10. The set of requirements for model 10 includes a set of benchmarks that the completed model, when executed, should be to satisfy. Also included in the technical computing environment 4 is a plurality of sets of test vectors 12. The plurality of sets of test vectors are different test parameters used to test the system while being designed in order to determine whether or not the design system satisfies the sets of requirements for the model 10. A display device 20 in communication with the electronic device 2 may include a block diagram view 22 of the system model being designed.

Block diagrams are used to model real-world systems. Historically, engineers and scientists have utilized time-based block diagram models in numerous scientific areas to study, design, debug, and refine dynamic systems. Dynamic systems, which are characterized by the fact that their behaviors change over time, are representative of many real-world systems. A dynamic system (either natural or man-made) is a system whose response at any given time is a function of its input stimuli, its current state, and the current time. A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant at which the connecting blocks are enabled. The source block of a signal writes to the signal at a given time instant when its system equations are solved. The destination blocks of this signal read from the signal when their system equations are being solved. The user 24 who is accessing the electronic device 2 may view the results of a simulation of the system model in the block diagram view 22 generated on the display 20. Upon successful completion of the design of the system model the system model frequently will be the basis of a real-life deployed system 30.

The electronic device 2 may be any of a number of different types of computing devices equipped with a processor and able to execute computer instructions. For example, the electronic device 2 may be a server, client, workstation, laptop, mainframe, PDA, or other type of device equipped with a processor. The display 20, rather than displaying a block diagram view 22, may display some other type of user interface showing the results of the modeling of the system that is being performed to determine the degree to which the design system satisfies the set of requirements for the model 10. The plurality of sets of test vectors 12 may correspond to the various requirements for the model 10 and are used as inputs to the design system during the test of the system in order to determine how much of the model design is excited by the use of the different test vectors.

Figure 2:
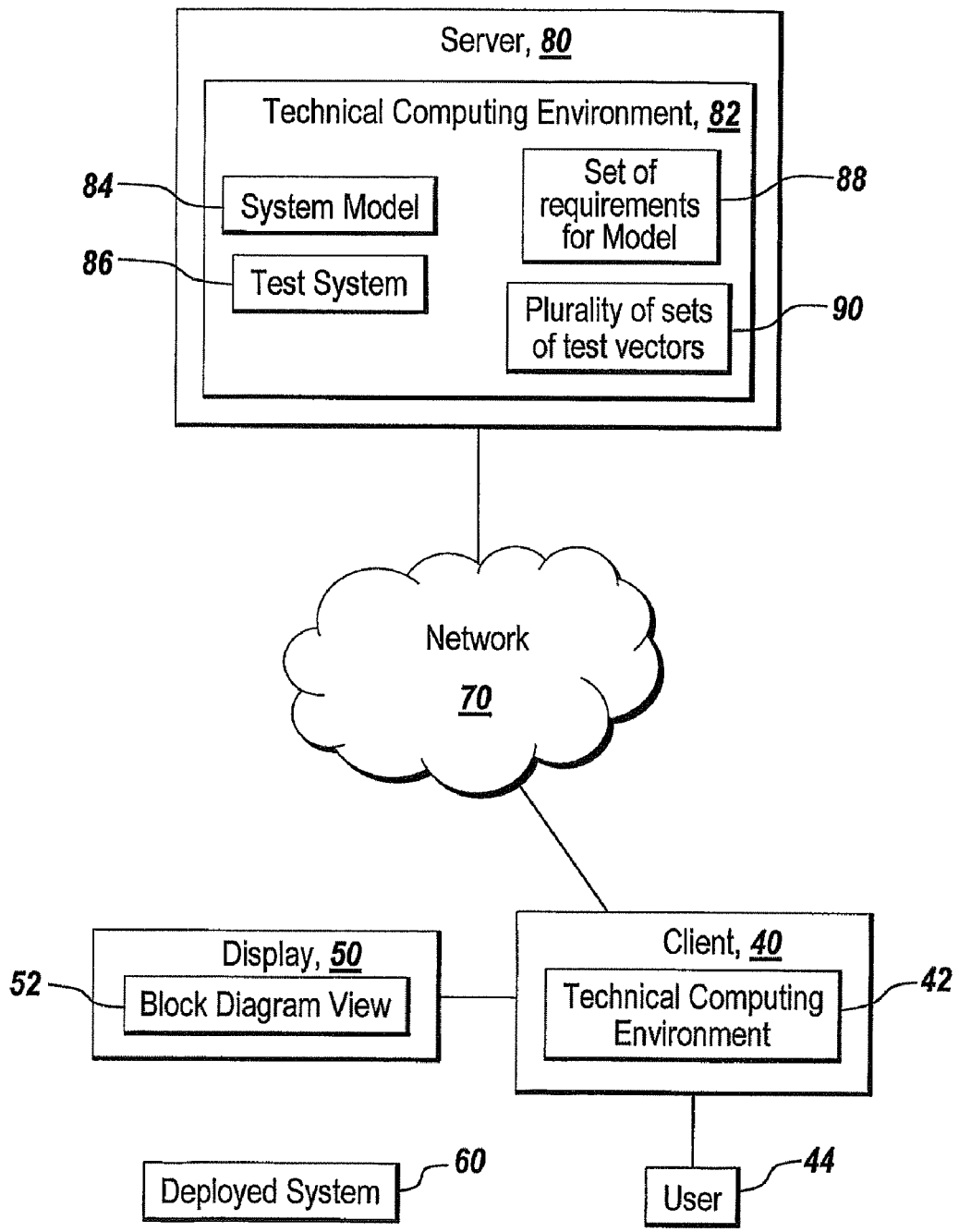
FIG. 2 depicts an alternate distributed environment suitable for practicing the illustrative embodiment of the present invention.

FIG. 2 depicts an alternate distributed architecture environment suitable for practicing the illustrative embodiment of the present invention. A server 80 hosts a technical computing environment 82. The technical computing environment 82 includes a system model 84, test system 86, set of requirements for the model 88 and a plurality of sets of test vectors 90. A client 40 communicates over a network 70 with the server 80. The client 40 may also include a technical computing environment 42 or may be a thin client receiving the results of the operations performed in the technical computing environment 82 on the server 80. Also communicating with the client 40 is the display 50 which may show a block diagram view 52 of the model undergoing a test. A user 44 accessing the client 40 monitors the results of the model test via the display 50. Upon successful design of the system a deployed real life system 60 may be generated. The network 70 may be an internet, intranet, local area network (LAN), wide area network (WAN), the Internet or some other type of network. Those skilled in the art will recognize that the various components that are depicted as being included within the technical computing environment 82 may be located remotely from the technical computing environment 82 in a location that is accessible over the network 70.

The coverage analysis performed during system design is performed to check whether the functionality embodied by the current state of the designed model satisfies the requirements set forth for the system. To perform the coverage analysis, a number of test vectors that may or may not correspond to requirement scenarios are used as input to the designed system and an analysis shows whether and how much of the design is excited/activated by the use of those particular test vectors. This information can be exploited to do directed testing when a fault has occurred as the functionality that is suspected to be affected by the fault can be optimally tested.

In addition to modeling the actual system, engineers have the ability to model the test system used to test the actual part. By using this model of the test system users can develop test vectors to exercise parts of the model. The present invention thus may include two types of models: one model is the system under test called the DUT (DUT) and one model for the test system itself. The user can then exercise the DUT by producing different test vectors. Each test vector will test different requirements and scenarios of the DUT.

Figure 3:
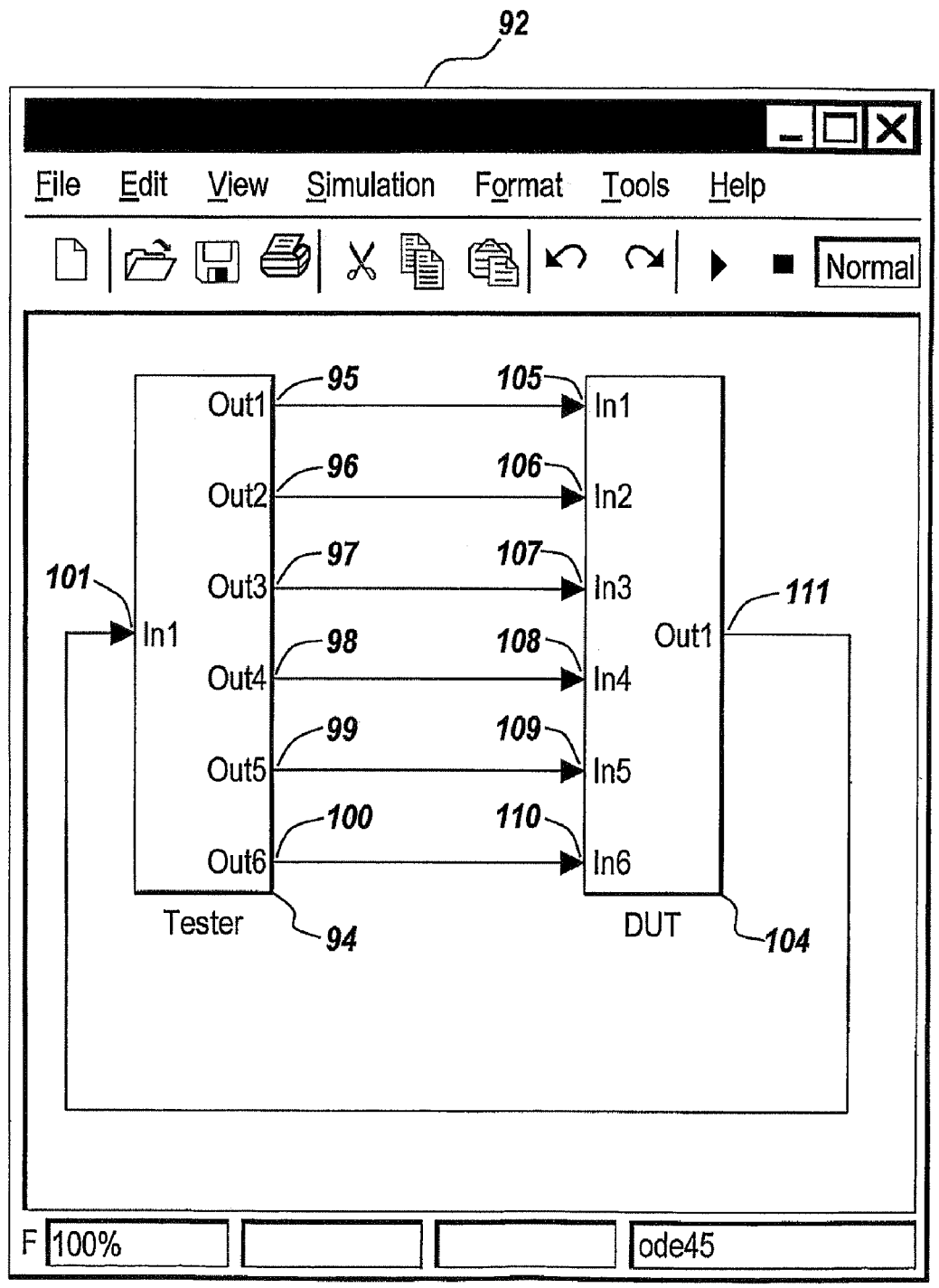
FIG. 3 depicts a block diagram view of a test system used to generate sets of test vectors for a system being tested.

FIG. 3 illustrates the ability of the present invention to use a test system to utilize a set of test vectors to simulate the execution of a system/DUT. A block diagram view 92 shows a tester system 94 and a system being designed 104. The tester system 94 includes outputs 95, 96, 97, 98, 99 and 100. The system being designed 104 includes inputs 105, 106, 107, 108, 109 and 110. A set of test vectors is used in tester system 94 to produce output values transmitted through the outputs 95, 96, 97, 98, 99 and 100 which are in turn received via the inputs 105, 106, 107, 108, 109 and 110 of the system being designed. The system being designed 104 is executed using the received values. The system being designed 104 also includes an output 111 which is used to transmit the values resulting from the execution of the model using the set of test vectors back to the input 101 of the tester system. The execution path of the DUT is recorded when executing each set of test vectors. The illustrative embodiment of the present invention records which components are executed in the DUT and for what portion of the total execution time.

The technical computing environment 4, 42, or 82 generates a model coverage analysis report for each of these sets of test vectors created in the combined model (the test system and the DUT) based on the recorded detail. Sample model coverage analysis reports are discussed below. These coverage analysis reports describe what parts of the DUT were tested for each test vector and the testing results. The results in the coverage analysis report description may be returned as a percentage of time active. The results inform the user what parts of the model are being tested with each set of test vectors. Following the receipt of an error in a deployed system (an indication that the system is not working as expected and/or designed) based on the system model, the illustrative embodiment of the present invention uses the coverage analysis report of the DUT to determine which sets of test vectors are necessary to do a directed test for the suspected failed model component. Errors may be faults of different types such as abrupt and incipient faults.

The following table is an example of the coverage analysis report generated for each set of test vectors. The left column is a list of components found in the DUT and each column after that is the coverage number for a given test vector input to the test system.

| DUT Block | Test Vector 1 | Test Vector 2 | Test Vector 3 |
| --- | --- | --- | --- |
| DUT | 75% | 50% | 25% |
| BlockA | 75% | 25% | 25% |
| BlockB | 50% | 75% | 25% |
| BlockC | 25% | 50% | 75% |

Using these numbers the user can now understand what test to run to find the problem in a more rapid manner. If the device comes in for maintenance and the suspected problem is BlockC then the user will know to run test vector 3 because the coverage for BlockC is higher for this test vector (75%). In comparison, for the above test vectors, running test vector 1 results in blockC being activated only 25% of the time. Similarly, running test vector 2 results in blockC being activated only 50% of the time. If the execution of test vector 3 fails to diagnose the problem, the user may run Test vector 2 and Test vector 1 until the problem is found. The coverage analysis report thus allows the test programs to direct the test sequence based on which test vectors are more likely to exercise the area of concern.

Figure 4:
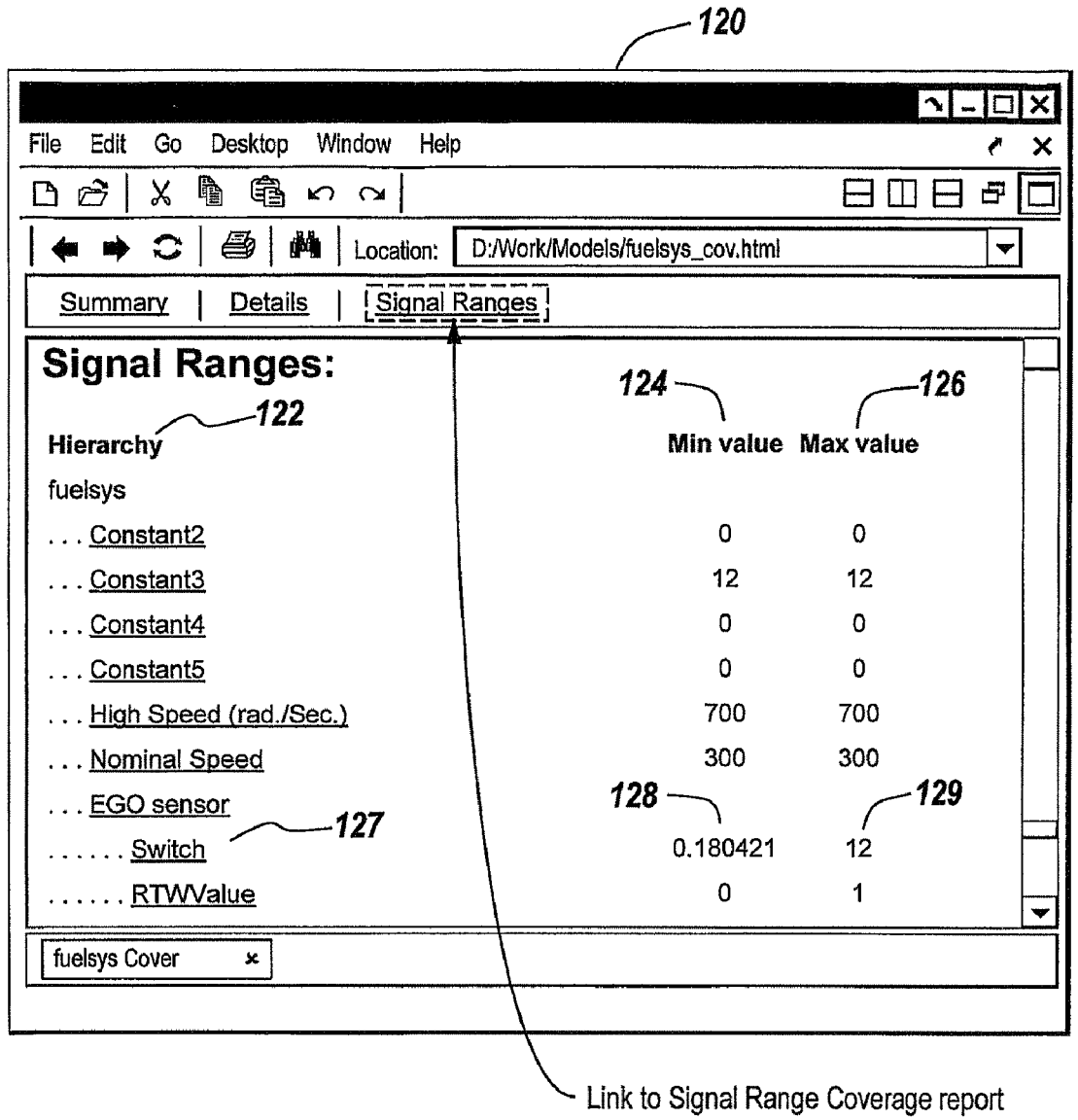
FIG. 4 depicts a screenshot of a signal range analysis report.

The coverage analysis reports may include coverage for many different types of areas including lookup tables, whether particular states were entered into in a STATEFLOW diagram, ranges of signal and types of transitions for a switch. For example, if signal range analysis is selected as a coverage selection, then the coverage analysis report will include the maximum and minimum signal values at each block in the model measured during simulation. FIG. 4 depicts a screenshot 120 of a signal range analysis report. The signal range analysis report includes a hierarchical listing of blocks 122 with child blocks being listed under parent blocks. Each block has a corresponding minimum value 124 and maximum value 126. Thus, for the depicted switch block 127 the minimum value 128 is listed as 0.180421 during simulation and the maximum value 129 is listed as 12.

Figure 5A:
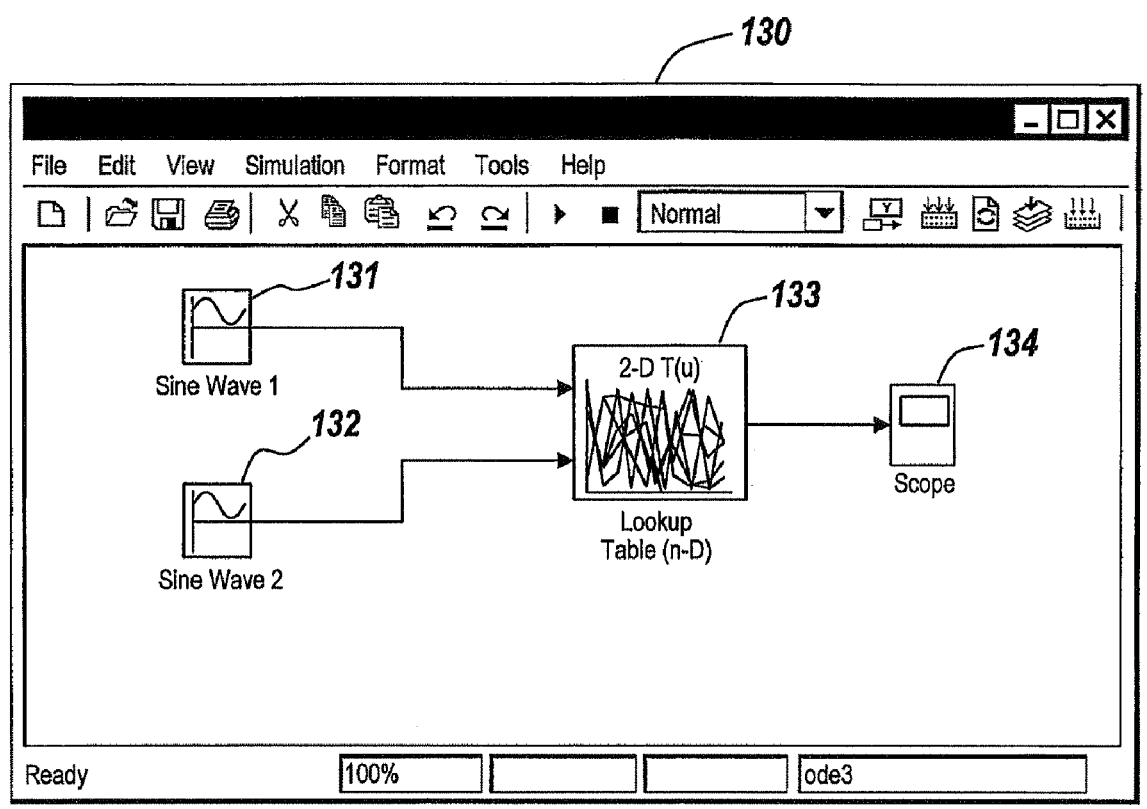
FIG. 5A depicts a screenshot of a block diagram including a lookup table block.
Figure 5B:
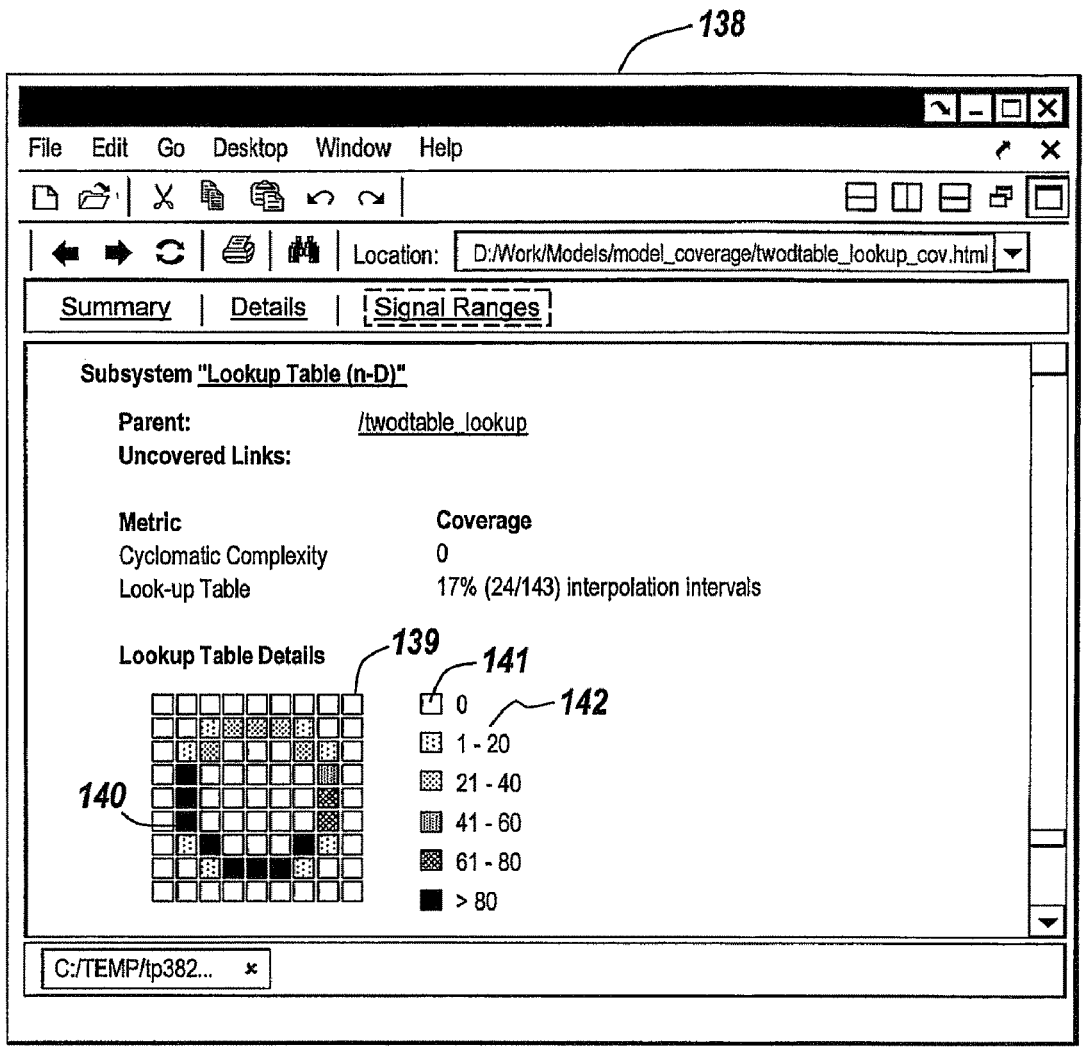
FIG. 5B depicts a screenshot of a lookup table analysis report.

The coverage analysis reports may also include lookup table coverage. Lookup table coverage analysis examines blocks that output the result of looking up one or more inputs in a table of inputs and outputs, interpolating between or extrapolating from table entries as necessary. Lookup table coverage records the frequency that table lookups use each interpolation interval. A test case achieves full coverage if it executes each interpolation and extrapolation interval at least once. For each lookup table block in the model, the coverage report may display a colored map of the lookup table indicating where each interpolation was performed. For example, FIG. 5B depicts a screenshot 138 of an exemplary lookup table 139 represented by a lookup block 133 in FIG. 5A. FIG. 5A is a screenshot 130 of a block diagram showing Sine Wave 1 block 131, Sine Wave 2 block 132, the lookup table block 133 and a scope block 134. The lookup table 139 is 10×10 elements filled with random values that are accessed with x and y indices generated from the two Sine Wave blocks 131 and 132. The Sine Wave 2 block 132 is out of phase with the Sine Wave 1 block 131 by pi/2 radians. The execution of the Sine Wave blocks 131 and 132 generates x and y numbers for the edge of a circle which become apparent when examining the Lookup table coverage report in FIG. 5B. An individual cell 140 in the lookup table report may be selected by the user and the selection results in the generation of a display of the index location of the cell and the exact number of execution counts generated for the cell during testing. Different levels of shading 141 may be used to represent ranges 142 of execution counts.

The coverage analysis report may also analyze Cyclomatic complexity, decision coverage, condition coverage, and modified condition/decision coverage (MC/DC).

Cyclomatic complexity analysis measures the structural complexity of a model. It approximates the McCabe complexity measure for code generated from the model. In general, the McCabe complexity measure is slightly higher because of error checks that the model coverage analysis does not consider. Model coverage uses the following formula to compute the cyclomatic complexity of an object (block, chart, state, etc.)

$$c = \sum_{1}^{N} (o_n - 1)$$

where N is the number of decision points that the object represents and $o_n$ is the number of outcomes for the nth decision point. The tool adds 1 to the complexity number computed by this formula for atomic subsystems and Stateflow charts.

Decision coverage analysis examines items that represent decision points in a model, such as a Switch block or Stateflow states. For each item, decision coverage determines the percentage of the total number of simulation paths through the item that the simulation actually traversed. A screenshot 145 of a decision analysis report is depicted in FIG. 6.

Condition coverage analysis examines blocks that output the logical combination of their inputs (for example, the Logic block), and Stateflow transitions. A test case achieves full coverage if it causes each input to each instance of a logic block in the model and each condition on a transition to be true at least once during the simulation and false at least once during the simulation. Condition coverage analysis reports for each block in the model whether the test case fully covered the block. A screenshot 147 of a condition coverage analysis report is depicted in FIG. 7.

Modified condition/decision coverage (MC/DC) analysis examines blocks that output the logical combination of their inputs (for example, the Logic block), and Stateflow transitions to determine the extent to which the test case tests the independence of logical block inputs and transition conditions. A test case achieves full coverage for a block if, for every input, there is a pair of simulation times when changing that input alone causes a change in the block's output. A test case achieves full coverage for a transition if, for each condition on the transition, there is at least one time when a change in the condition triggers the transition. A screenshot 149 of a modified condition/decision analysis report is depicted in FIG. 8.

It will be appreciated that multiple types of reports may be combined in order to display data to a user. For example, a model coverage report for a SIMULINK model may include signal range analysis, Lookup table analysis, decision analysis, condition analysis, MC/DC analysis and state-transition analysis (for an embedded STATEFLOW block). The data may be cross-linked so that the user may easily navigate from one set of data to the next.

In addition to providing information about the DUT, the coverage analysis report also highlights areas in the Test system connected to the DUT that are used. The coverage analysis report further indicates the resources in the test system that are not used in the testing of the DUT.

Figure 9:
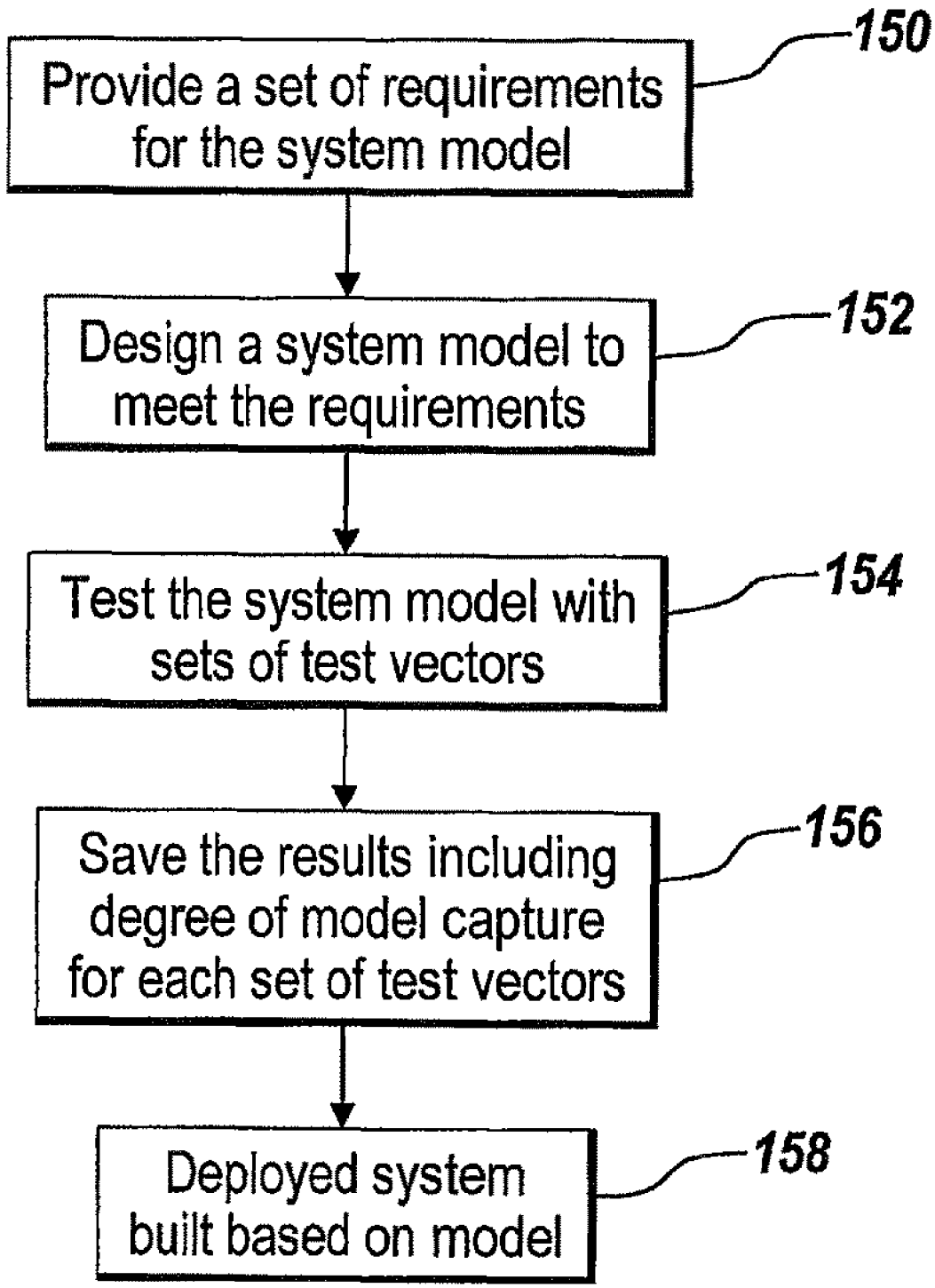
FIG. 9 is a flow chart of the sequence of steps illustrated by the illustrative embodiment of the present invention to perform model verification.

FIG. 9 depicts the sequence of steps followed by the illustrative embodiment of the present invention to initially validate a model using a plurality of sets of test vectors. The sequence begins with the provision of a set of requirements for the system model (step 150). For example, the set of requirements may indicate that a certain component be active at least seventy five percent of the time in order to ensure efficient operation of the system. Similarly, the set of requirements may indicate that a particular component be active no more than ten percent of the time in order to prevent component overuse. Those skilled in the art will recognize that the particulars of the set of requirements will vary depending upon the purpose and functionality of the system being designed. The user then designs a system model in an attempt to meet the set of requirements (step 152). The system model is then tested using the plurality of sets of test vectors (step 154) with the results of each set of test vectors including the degree of model capture being saved (step 156). For example, referring back to FIG. 3, each set of test vectors may provide different output values 95, 96, 97, 98, 99 and 100 for the test system and correspondingly different input values 105, 106, 107, 108, 109 and 110 for the DUT 104 which result in a different execution path in the DUT and a different output value. Alternatively, the same components may be executed within the DUT 104 with different sets of test vectors but the different sets of test vectors may result in different components being executed for differing percentages of time. Returning to FIG. 9, upon determining a degree of model capture that satisfies the set of requirements for the system model, a deployed system is built based on the model (step 158). The results of the tests of the system model are saved in a report indicating which model components are excited by the use of a particular set of test vectors. The model may also indicate the percentage of the overall model that is excited by a particular set of test vectors and other similar data.

Figure 10:
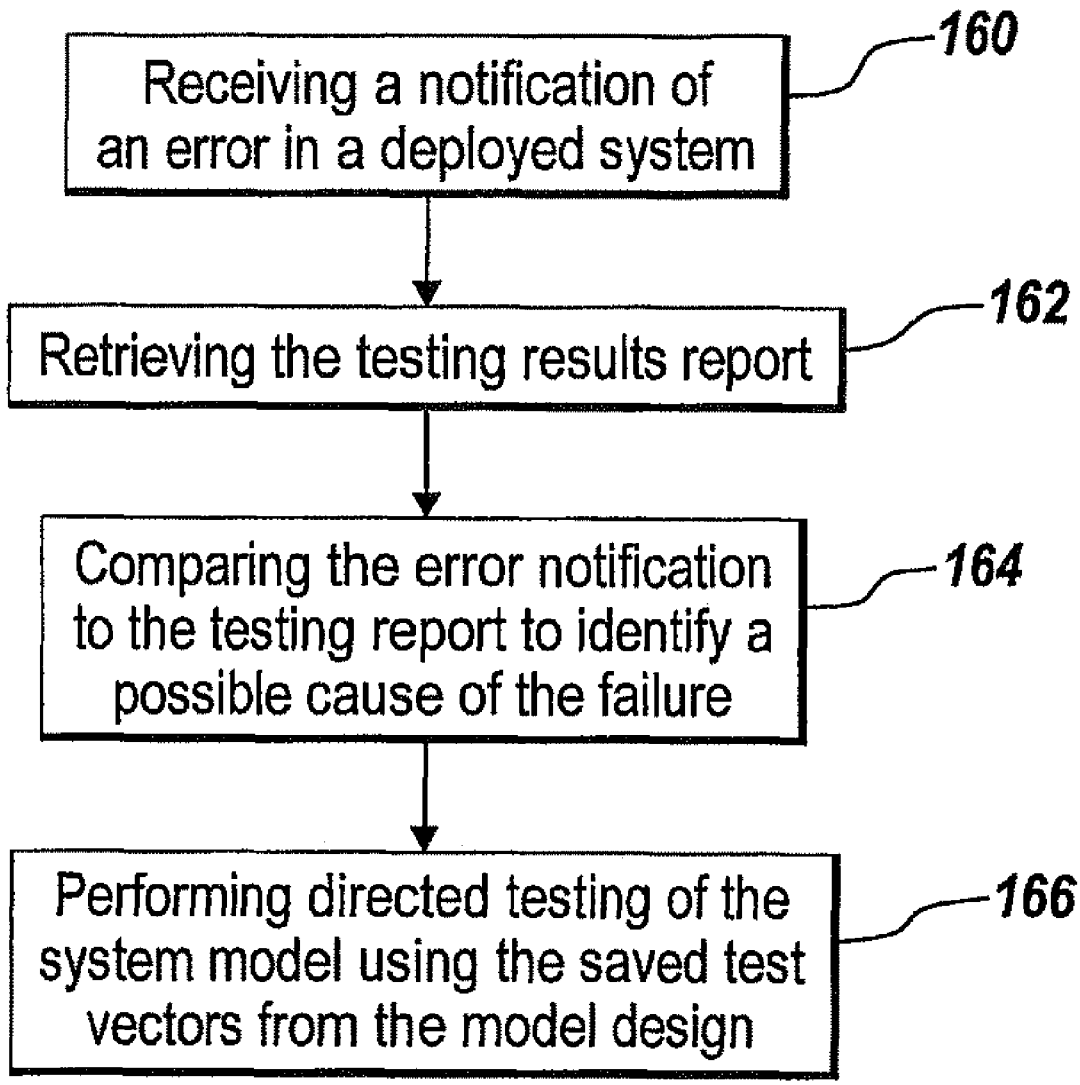
FIG. 10 is a flow chart of the sequence of steps followed by the illustrative embodiment of the present invention to use the results of a previously performed model verification to generate directed test vectors to identify reported faults.

FIG. 10 depicts the sequence of steps followed by the illustrative embodiment of the present invention to use the results of the test validation that are performed during the initial system design in a subsequent effort to identify a failed component in a deployed system. The sequence begins with the user receiving a notification of an error in a deployed system (step 160). The results of the previous testing that was performed on the system during the model design are then retrieved (step 162). The error notification is then compared to the testing report to identify a possible cause of the failure (step 164). For example, the error notification may suggest that a particular component in the deployed system has failed and the testing results report may indicate which sets of test vectors ordinarily would cause that particular component to be excited during a simulation. Once the comparison has been made, directed testing of the system model using the saved test vectors from the model design may be used so that the test vectors are targeted to the particular suspected failed component (step 166). It will be appreciated by those skilled in the art that the previous testing results using the test vectors may be used in combination with other reliability data. Thus directed testing could be performed towards a particular component that past reliability data indicates is most likely to fail even if the coverage report indicates another component is slightly more likely to be the cause of the failure. In such a scenario, the coverage report generated from the plurality of test vectors is a factor in the determining what directed testing to perform but not the sole factor.

The information in the coverage analysis report from the design phase may be retrieved in a number of different ways. In one implementation, the results contained in the coverage analysis report are presented to a user who makes a manual selection of which set of test vectors to use to verify a suspected fault in a deployed system. In another implementation, the process is automated with the set of test vectors with the greatest degree of model capture for the suspected fault being automatically selected and provided to the test system. In a different implementation, the set of test vectors with the greatest likelihood of exciting the suspected failed component is automatically selected and presented to a user for manual confirmation. Those skilled in the art will recognize that other implementations combining different automatic and manual selections are also possible within the scope of the present invention.

In one aspect of the illustrative embodiment, the coverage analysis report is linked to the block diagram view being shown to the user. A selection of a component in the coverage analysis report causes the associated component in the block diagram view to become highlighted or otherwise visibly identifiable so as to provide a visual cue to the user regarding the particular portion of the model in question. The block diagram view may be used to show the execution path of the model during a simulation performed using a selected set of test vectors. Similarly, the present invention may be configured so that a selection in the block diagram view results in a highlighting/visual identification of the information regarding the component in the coverage analysis report.

The illustrative embodiment of the present invention may also be used to analyze a computer designed model of a deployed system following the initial design phase. Although the examples contained herein have described the use of a model coverage analysis report that is generated during the design phase to determine compliance with a set of requirements, it will be appreciated that the model coverage analysis report may be generated following the initial design phase and then serve as the basis for fault identification in the deployed system using the mechanisms described above. As long as the model coverage analysis report is generated before the deployed system generates a fault, it provides a baseline which may be used for future fault analysis.

Although the descriptions contained herein have made reference to a block diagram view being used to present the coverage analysis and other information to the user, it will be appreciated by those skilled in the art that other types of user interfaces may be utilized without departing from the scope of the present invention.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include C, C++, C#, or JAVA. The software programs may be stored on or in one or more mediums as object code.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

I claim:

1. A computer-implemented method comprising:
   creating a system model within a technical computing environment operating on an electronic device having a processor, the system model models characteristics of a real-world system, the system model including a plurality of sub-portions that each correspond to a component of the real-world system;
   applying a plurality of test vectors to the system model;
   measuring coverage achieved by the test vectors on the sub-portions of the system model;
   matching a suspected failed component of the real-world system to a particular sub-portion of the system model;
   selecting a test vector of the plurality of test vectors to be applied to the real-world system to test the suspected failed component in response to the measured coverage achieved on the particular sub-portion of the system model; and
   applying the selected test vector to the real-world system, wherein the real-world system is a deployed system that is deployed outside of the technical computing environment within which the system model was created.

2. The computer-implemented method of claim 1 wherein the selected test vector is a test vector for which the measured coverage achieved on the particular sub-portion of the system model is the highest.

3. The computer-implemented method of claim 1 wherein coverage indicates a percentage of time a sub-portion of the system model is activated.

4. The computer-implemented method of claim 1 further comprising:
   generating a coverage analysis report that includes the measured coverage achieved by the plurality of test vectors on sub-portions of the system model; and
   storing the coverage analysis report.

5. The computer-implemented method of claim 4 wherein selecting further comprises automatically choosing the selected test vector based upon the coverage analysis report.

6. The computer-implemented method of claim 1 wherein the system model is a block diagram model that includes a plurality of blocks interconnected by lines that represent signals.

7. The computer-implemented method of claim 6 wherein each sub-portion of the system model comprises one or more blocks of the block diagram model.

8. The computer-implemented method of claim 1 further comprising:
   determining one or more design requirements for the real-world system; and
   generating at least some of the plurality of test vectors in response to the design requirements.

9. An electronic-device-readable storage media comprising instructions executable by an electronic device to:
   simulate a system model within a technical computing environment, the system model models characteristics of a real-world system, the system model including a plurality of sub-portions that each correspond to a component of the real-world system;
   measure coverage achieved by a plurality of test parameters on the sub-portions of the system model;
   receive a notification of a suspected failed component of the real-world system, the suspected failed component corresponding to a particular sub-portion of the system model; and
   select one or more of the plurality of test parameters to be applied to the real-world system to test the suspected failed component in response to measured coverage achieved on the particular sub-portion of the system model,
   wherein the real-world system is a deployed system that is deployed outside of the technical computing environment within which the system model was simulated.

10. The electronic-device-readable storage media of claim 9 wherein the instructions are further executable by the electronic device to:
    apply the selected one or more test parameters to the real-world system.

11. The electronic-device-readable storage media of claim 9 wherein the selected one or more test parameters are test parameters for which the measured coverage achieved on the particular sub-portion of the system model is the highest.

12. The electronic-device-readable storage media of claim 9 wherein coverage indicates a percentage of time a sub-portion of the system model is activated.

13. The electronic-device-readable storage media of claim 9 wherein the instructions are further executable by the electronic device to:
    generate a report that includes coverage achieved by the plurality of test parameters on the sub-portions of the system model; and
    store the report.

14. The electronic-device-readable storage media of claim 13 wherein the instructions are further executable by the electronic device to:
    automatically choose the selected one or more test parameters based upon the coverage analysis report.

15. The electronic-device-readable storage media of claim 9 wherein the system model is a block diagram model that includes a plurality of blocks interconnected by lines that represent signals.

16. The electronic-device-readable storage media of claim 15 wherein each sub-portion of the system model comprises one or more blocks of the block diagram model.

17. The electronic-device-readable storage media of claim 9 wherein the instructions are further executable by the electronic device to:
generate at least some of the plurality of test parameters in response one or more design requirements for the real-world system.

18. An apparatus comprising:
a processor;
a block diagram model of a real-world system, the block diagram model created within a technical computing environment and including a plurality of sub-portions that correspond to components of the real-world system; and
a test system configured to be executed by the processor to:
apply a plurality test vectors to the block diagram model,
measure coverage achieved by each of the test vectors on the sub-portions of the block diagram model, and
select a particular test vector of the plurality of test vectors to be applied to the real-world system to test a suspected failed component of the real world system, the selection in response to the measured coverage achieved by the particular test vector on one or more sub-portions of the block diagram model that correspond to the suspected failed component,
wherein the real-world system is a deployed system that is deployed outside of the technical computing environment within which the block diagram model was created.

19. The apparatus of claim 18 wherein the particular test vector achieved highest coverage on the one or more sub-portions that correspond to the suspected failed component.

20. The apparatus of claim 18 wherein coverage indicates a percentage of time activated.

21. The apparatus of claim 18 wherein the test system is a portion of a technical computing environment.

22. The apparatus of claim 18 wherein the test system is further configured to generate a coverage analysis report and to store the coverage analysis report.

23. A computer-implemented method, comprising:
creating a system model within a technical computing environment operating on an electronic device having a processor, the system model models characteristics of a real-world system, the system model including a plurality of sub-portions that each correspond to a component of the real-world system;
measuring coverage achieved by a plurality of test vectors on the sub-portions of the system model; and
selecting a test vector of the plurality of test vectors to be applied to the real-world system to test a suspected failed component of the real world system, the selected test vector chosen in response to the measured coverage achieved by the test vectors on a particular sub-portion of the system model that corresponds to the suspected failed component,
wherein the real-world system is a deployed system that is deployed outside of the technical computing environment within which the system model was created.

24. The method of claim 23 wherein the selected test vector achieved highest coverage on the particular sub-portion of the system model.

25. The method of claim 23 wherein coverage indicates a percentage of time a sub-portion of the system model is activated.

26. A computing-device-readable media comprising instructions executable by a computing device to:
test, in a technical computing environment, a system model using sets of test vectors, the system model having one or more components;
identify, based on the test, a degree of model capture associated with each set of test vectors used to test the system model, the degree of model capture indicating how many components of the system model are excited by each set of test vectors when used to test the system model;
save in a memory the sets of test vectors following the testing of the system model;
receive a report of a fault in a deployed system;
based upon the reported fault in the deployed system, select from the sets of test vectors a set of test vectors for application to the deployed system, the set of test vectors that is selected being the set of test vectors that provided a greatest degree of model capture during the testing of the system model based on which set of test vectors excited the highest percentage of components of the system model with respect to other sets of test vectors; and
apply the selected set of test vectors to the deployed system to identify the error in the deployed system,
wherein the deployed system is based on the system model and is a real-life system deployed outside of the technical computing environment.

27. A computing-device-readable media comprising instructions executable by a computing device to:
test, in a technical computing environment, a system model using sets of test vectors, the system model has a plurality of model portions, and each set of test vectors used to test the system model provides a degree of activation of each model portion;
for each set of test vectors, identify the degree of activation of each model portion, the degree of activation indicating how often each corresponding model portion is activated;
save in a memory the sets of test vectors following the testing of the system model;
receive a report of a fault in a deployed system;
identify a component of the deployed system suspected of causing the reported fault in the deployed system;
based upon the reported fault in the deployed system, select from the sets of test vectors a set of test vectors for application to the deployed system, the set of test vectors that is selected being the set of test vectors that provides a greatest degree of activation of the model portion that corresponds to the component of the deployed system suspected of causing the reported fault, the greatest degree of activation based on which set of test vectors most activated the component suspected of causing the reported fault with respect to other sets of test vectors; and
apply the selected set of test vectors to the deployed system to identify the error in the deployed system,
wherein the deployed system is based on the system model and is a real-life system deployed outside of the technical computing environment.

28. A computing-device-readable media comprising instructions executable by a computing device to:
test, in a technical computing environment, a system model using a plurality of sets of test vectors, the system model having one or more components;
identify a degree of model capture associated with each set of test vectors used to test the system model, the degree of model capture indicating how many components of the system model are excited by each set of test vectors when used to test the system model;

save in a memory the sets of test vectors following the testing of the system model;

select, based upon a reported fault in a deployed system, a set of test vectors, from the plurality of sets of test vectors, for application to the deployed system, the set of test vectors that is selected being the set of test vectors that provided a greatest degree of model capture during the test of the system model based on which set of test vectors excited the highest percentage of components of the system model with respect to other sets of test vectors; and apply the selected set of test vectors to the deployed system to identify the error in the deployed system, wherein the deployed system is based on the system model and is a real-life system deployed outside of the technical computing environment.

* * * * *